US005404026A

United States Patent [19]

Mariella, Jr. et al.

[11] Patent Number: 5,404,026

[45] Date of Patent: Apr. 4, 1995

[54] INFRARED-SENSITIVE PHOTOCATHODE

[75] Inventors: Raymond P. Mariella, Jr., Danville; Gregory A. Cooper, Pleasant Hill, both of Calif.

[73] Assignee: Regents of the University of California, Oakland, Calif.

[21] Appl. No.: 4,766

[22] Filed: Jan. 14, 1993

[51] Int. Cl.[6] .................. H01L 29/161; H01L 29/205

[52] U.S. Cl. .................. 257/10; 257/11; 257/15; 257/21; 257/191

[58] Field of Search .................. 257/15, 21, 22, 185, 257/191, 10, 11; 313/542, 501, 345 R

[56] References Cited

U.S. PATENT DOCUMENTS

| | | | |
|---|---|---|---|
| 3,631,303 | 12/1971 | Antypas | 257/184 |
| 3,769,536 | 10/1973 | Antypas et al. | 313/94 |
| 3,814,993 | 6/1974 | Kennedy | 257/441 |
| 3,900,865 | 8/1975 | Schaefer | 257/184 |
| 3,914,136 | 1/1975 | Kressel | 313/94 |
| 3,953,880 | 4/1976 | Hara et al. | 257/10 |
| 3,960,620 | 6/1976 | Ettenberg | 257/437 |
| 4,015,284 | 3/1977 | Hara et al. | 257/10 |
| 4,686,556 | 8/1987 | Dietrich | 257/10 |
| 4,749,903 | 6/1988 | Munier et al. | 257/10 |
| 4,829,355 | 5/1989 | Munier et al. | 257/11 |
| 5,047,821 | 9/1991 | Costello et al. | 257/472 |

OTHER PUBLICATIONS

J. J. Scheer et al., "GaAs-Cs: A New Type of Photoemitter", *Solid state Communications*, vol. 3, pp. 189-193, (1965).

R. E. Simon et al., "Field Induced Photoemission and Hot-Electron Emission from Germanium", *Letter to the Editor*, 1960, pp. 1505 & 1506.

R. L. Bell et al., "Transferred Electron Photoemission from InP", *Applied Physics Letters*, vol. 25, No. 11, pp. 645-646, Dec. 1, 1974.

J. S. Escher et al., "Field-Assisted Photoemission from an InP/InGaAsP/InP Cathode", *CRC Critical Reviews in Solid State Sciences*, pp. 577-583, Nov. 1975.

W. E. Spicer, "Negative Affinity 3-5 Photocathodes: Their Physics and Technology", *Applied Physics*, vol. 12, pp. 115-130, (1977).

R. Sahai et al., "Double-Heterojunction Photocathode Devices", *CRC Critical Reviews in Solid State Sciences*, pp. 565-576, Nov. 1975.

*Primary Examiner*—Rolf Hille
*Assistant Examiner*—Minhloan Tran
*Attorney, Agent, or Firm*—Henry P. Sartorio

[57] ABSTRACT

A single-crystal, multi-layer device incorporating an IR absorbing layer that is compositionally different from the $Ga_xAl_{1-x}Sb$ layer which acts as the electron emitter. Many different IR absorbing layers can be envisioned for use in this embodiment, limited only by the ability to grow quality material on a chosen substrate. A non-exclusive list of possible IR absorbing layers would include GaSb, InAs and $InAs/Ga_wIn_yAl_{1-y-w}Sb$ superlattices. The absorption of the IR photon excites an electron into the conduction band of the IR absorber. An externally applied electric field then transports electrons from the conduction band of the absorber into the conduction band of the $Ga_xAl_{1-x}Sb$, from which they are ejected into vacuum. Because the band alignments of $Ga_xAl_{1-x}Sb$ can be made the same as that of GaAs, emitting efficiencies comparable to GaAs photocathodes are obtainable. The present invention provides a photocathode that is responsive to wavelengths within the range of 0.9 $\mu m$ to at least 10 $\mu m$.

17 Claims, 3 Drawing Sheets

INFRARED-SENSITIVE PHOTOCATHODE

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to a photocathode that is responsive to wavelengths within the range of 0.9 μm to at least 10 μm. More specifically, it relates to the combination of an infrared (IR) absorbing semiconductor (GaSb, InAs, or a superlattice of $Ga_wIn_yAl_{1-y-w}Sb$ and InAs) with an electron emitter made of $Ga_xAl_{1-x}Sb$.

2. Description of Related Art

The general concept of a semiconductor-based, infrared-sensitive photocathode was published in the 1970's. Prior to this, the "standard" S-1 metallic photocathode was usable for light with wavelengths out to about 1.3 μm, but the S-1 photocathode is plagued with high noise levels and relatively low quantum yield. With the invention of the p-type GaAs photocathode [J. J. Scheer and J. Van Laar, *Solid State Comm.*, 3, 189 (1965)], excellent performance was demonstrated for light with wavelengths out to about 0.9 μm. In general, semiconductor photocathodes are p-doped. This causes downward band bending at the cesiated surface and causes ballistic ejection of the conduction-band electrons through the Cs/CsO into the vacuum. The p-doped GaAs photocathode has the highest quantum efficiency of any photocathode for visible and nearest-IR light. For light between 0.9 μm and 1.3 μm, the S-1 photocathode still had to be used.

Two general approaches which use semiconductors to improve their quantum efficiency and IR response compared to the S-1 photocathode have been proposed. In the first approach, a single material both absorbs the light and emits the photogenerated electrons into the vacuum, but the bandgap of the semiconductor was simply lowered by epitaxially growing $In_xGa_{1-x}As$ or $GaAs_{1-x}Sb_x$, with small x, on GaAs, for example, as demonstrated in U.S. Pat. No. 3,814,996 (1974) by Enstrom and Fisher. Unfortunately, lowering the bandgap in this way below about 1.4 eV quickly kills the efficiency of the electron emitter, so this simple approach did not extend the sensitivity to light with wavelengths longer than 1.3 μm.

The second approach was to use externally applied electric fields on the semiconductors in the photocathode to force the electrons to move from one physical region to another and to transfer them from the lowest conduction band, Γ (gamma), to the next higher band, L or X, where the electrons would have enough energy to escape into the vacuum. The earliest and simplest example of this was in germanium, which showed $10^{-6}$ electrons/photon with a bias of 6 volts applied [R. E. Simon and W. E. Spicer, *J. Appl. Phys.*, 31, 1505 (1960)]. This configuration was improved by fabricating the photocathode with at least two semiconductor components comprised of an IR absorber such as InGaAsP, and an InP electron emitter. By applying an electric field, the electrons were transported from the IR absorber and promoted from the Γ to the L conduction band [R. L. Bell, et al, *Appl. Phys. Lett.*, 25, 645 (1974); J. S. Escher, et al, *CRC Critical Reviews in Solid State and Materials Science*, 5, 577.(1975).]. With this approach, photocathodes with quantum yields of greater than 0.1% to wavelengths as long as 1.4 μm have been demonstrated [See the review article by W. Spicer, *Applied Physics*, 12, 115 (1977)].

Solid-state photodetectors which used electron transport across compositionally different materials have been fabricated at Rockwell Science Center [R. Sahai, et al, *CRC Critical Reviews in Solid State and Materials Science*, 5, 565.(1975)]. In previous work, photocathode devices were cooled to as low as −100° C. in order to reduce the dark current. For devices which operate in the IR region, the need for some cooling can be expected. In an ideal device, the thermal generation of electron-hole pairs within the IR absorber would be the biggest source of dark current. The positively biased contact on the emitter, used to form the internal electric field, also can inject holes into the photocathode. This has several detrimental effects including non-uniform electric fields across the surface of the photocathode, impact generation of electron-hole pairs, and loss of signal electrons as they are transported from the IR absorber to the surface. Hole injection can be reduced by making a Schottky surface contact. Hole blocking layers composed of materials with a valence band offset with respect to the emitter could also be inserted between the electron emitter and the IR absorber.

From the prior art, it follows that in general, a single-crystal semiconductor device needs at least the following two components to work as an infrared-sensitive photocathode (IR-photocathode):

1. An IR absorber, i.e. a semiconductor which absorbs the IR light and promotes an electron into its conduction band in the process of IR absorption and;
2. An electron emitter, i.e. a material which receives the electron from the conduction band of the IR absorber into its own conduction band (using an applied voltage bias) and then ejects the electron into vacuum.

The device may also need a graded (i.e. linearly) region between the IR absorber and the electron emitter to facilitate the electron transport to the surface.

When an absorber is used which has a smaller bandgap than the substrate, the photocathode may be used in a transmission mode where the photons to be detected pass through the substrate to the absorbing layer. The photogenerated electrons move toward the emitter and are ejected into a vacuum. The substrate acts as an optical filter by absorbing photons with energy greater than the bandgap of the substrate. In the case of GaAs or GaSb substrates, none of the visible wavelengths is transmitted to the absorbing layer, yielding a "solar-blind" photocathode. The other common mode of operation is where the photons to be detected pass through the emitter surface and into the absorber. This is called the reflection mode of operation.

Using a gallium antimonide (GaSb) or gallium arsenide (GaAs) substrate, one can grow $InAs/Ga_wIn_yAl_{1-y-w}Sb$ superlattices (InAs stands for indium arsenide) which absorb IR light (wavelengths from 1.7 μm to 10 μm and longer have been reported). It is also known that GaSb, which absorbs IR wavelengths out to 1.7 μm, or InAs, which absorbs IR wavelengths out to 4 μm, can also be used as the IR absorbing component. It is desirable to combine these IR absorbing components with an electron emitter made of $Ga_xAl_{1-x}Sb$ to form a photocathode sensitive to wavelengths within the range of 0.9 μm to at least 10 μm. The present invention provides such an article.

SUMMARY OF THE INVENTION

It is an object of the present invention to provide an article combining an IR-absorbing semiconductor (GaSb, InAs, or a superlattice of $Ga_wIn_yAl_{1-y-w}Sb$ and InAs) with an electron emitter made of $Ga_xAl_{1-x}Sb$, and which may be operated below room temperature.

It is a further object of the present invention to provide a single crystal multiple layer device combining an IR absorbing layer with an electron emitter comprised of $Ga_xAl_{1-x}Sb$.

It is another object of the present invention to provide photocathodes that are responsive to wavelengths within the range of 0.9 μm to at least 10 μm.

It is another object of the present invention to provide a method for producing photocathodes that are responsive to wavelengths within the range of 0.9 μm to at least 10 μm.

It is another object of the present invention to provide a method for producing photocathodes with a reduced number of crystal defects.

The present invention relates to a single-crystal, multi-layer device combining an IR absorbing layer with an electron emitter comprised of $Ga_xAl_{1-x}Sb$. Many different IR absorbing layers can be envisioned for use in this embodiment, limited only by the ability to grow quality material on a chosen substrate, typically using molecular beam epitaxy (MBE) as the growth technique. A non-exclusive list of possible IR absorbing layers would include GaSb, InAs and a superlattice of $InAs/Ga_wIn_yAl_{1-y-w}Sb$. The absorption of the IR photon excites an electron into the conduction band of the IR absorber. An externally applied electric field then transports electrons from the conduction band of the IR absorber into the conduction band of the $Ga_xAl_{1-x}Sb$, from which they are ejected into a vacuum. Because the band alignment of $Ga_xAl_{1-x}Sb$, with $1-x$ in the range 0.7 to 1.0, can be made approximately the same as GaAs, we have experimentally observed emitting efficiencies for $Ga_xAl_{1-x}Sb$ comparable to GaAs photocathodes for samples prepared under identical conditions. A final GaSb "capping" layer, less than 10-nm thick, may be applied to retard chemical decomposition of the $Ga_xAl_{1-x}Sb$.

DETAILED DESCRIPTION OF THE INVENTION

Figure 1A:
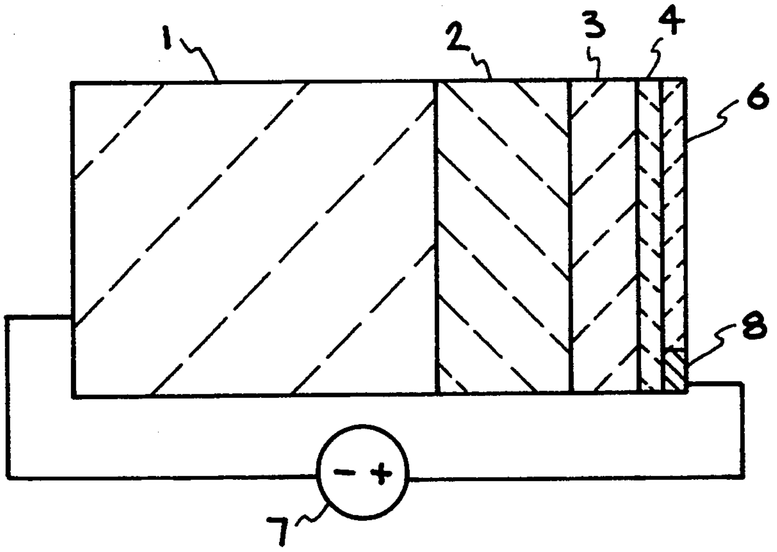
FIG. 1*a* shows a cross-sectional view of a preferred embodiment.

The present invention relates to photocathodes with usable sensitivities to electro-magnetic radiation within the wavelength range of 0.9 μm to at least 10 μm. One embodiment of the present invention, as shown in FIG. 1*a*, is sequentially comprised of substrate 1; infrared (IR) absorbing layer 2; energy transition layer 3; electron emitting layer 4; cesium layer 6 covering all but a small gap of electron emitting layer 4; and metal layer 8 in contact with electron emitting layer 4 and cesium layer 6. In operation, the photocathode includes positive bias 7 between metal layer 8 and substrate 1. Cooling means 12 are in contact with IR absorbing layer 2. Although the present photocathode does not require the Γ-to-L promotion, external electrical connections are still needed to transport the photogenerated electrons from IR absorber 2 to electron emitter 4, which is comprised of $Ga_xAl_{1-x}Sb$.

In a preferred embodiment, substrate 1 is comprised of GaSb or GaAs. Infrared absorbing layer 2 may be selected from a group of materials including GaSb, InAs, and a $InAs/Ga_wIn_yAl_{1-y-w}Sb$ superlattice. When IR absorbing layer 2 is comprised of GaSb, energy transition layer 3 is comprised of $Ga_xAl_{1-x}Sb$ and $1-x$ is graded (i.e. linearly) from at or near zero at absorbing layer 2 to 0.7 at emitting layer 4. Energy transition layer 3 may have first and second sub-layers where the first sub-layer is adjacent to IR absorbing layer 2 which is comprised of InAs or a $InAs/Ga_wIn_yAl_{1-y-w}Sb$ superlattice and where the InAs layers in the graded superlattice may have thicknesses that are progressively graded from the thickness used in absorbing layer 2 or 20 nanometers to one monolayer at the interface to the second sub-layer. The second sub-layer of energy transition layer 3 comprises $Ga_xAl_{1-x}Sb$ where $1-x$ is graded from a value at or near zero to 0.7 at the interface with electron emitting layer 4. Electron emitting layer 4 may be comprised of $Ga_xAl_{1-x}Sb$. A final GaSb capping layer may be grown on top of the $Ga_xAl_{1-x}Sb$ to retard its chemical decomposition, but should be less than 10-nm thick to allow ballistic transport of the photogenerated electrons from the $Ga_xAl_{1-x}Sb$ to the vacuum. The electron affinity at the surface of emitter 4, with or without the GaSb capping layer, is made negative by the standard method of heat cleaning followed by deposition of monolayers of Cs and oxidized cesium.

A method of producing an infrared sensitive photocathode comprises in sequence: providing substrate 1; epitaxially growing infrared absorbing layer 2 onto substrate 1; epitaxially growing energy transition layer 3 onto absorbing layer 2; epitaxially growing electron emitting layer 4 onto energy transition layer 3; and depositing cesium layer 6 onto a portion of electron emitting layer 4. Alternatively, hole block layer 5 may be grown onto energy transition layer 3 and electron emitting layer 4 may then be grown onto layer 5. Metal layer 8 may be deposited onto a portion of electron emitting layer 4 prior to the deposition of cesium layer 6. In operation, metal layer 8 is positively biased with respect to substrate 1. The quantum efficiency of the photocathode may be optimized by exposing cesium layer 6 to trace quantities of oxidants (Oxygen ($O_2$), Nitrous Oxide ($N_2O$), Fluorine ($F_2$), and Nitrogen Flouride ($NF_3$)) while cesium layer 6 is being deposited.

A close lattice match between absorbing layer 2 and substrate 1 is desirable in this method to reduce the density of crystal defects formed at the interface. Although the electrons that are photogenerated in the absorbing layer do not pass through this interface to get to the emitting surface, defects formed at this interface can propagate through subsequently grown layers through which the photogenerated electrons do pass. Crystal defects increase the chance that an electron will be trapped or recombine with a hole which lowers the efficiency of transporting photogenerated electrons to the emitting surface and, thus, reduces the quantum yield of the device. Using Molecular Beam Epitaxy (MBE), we have successfully grown epilayers of $Ga_xAl_{1-x}Sb$ onto GaSb substrates, resulting in a low concentration of crystalline defects, as can be seen via transmission-electron micrographs.

Figure 3A:
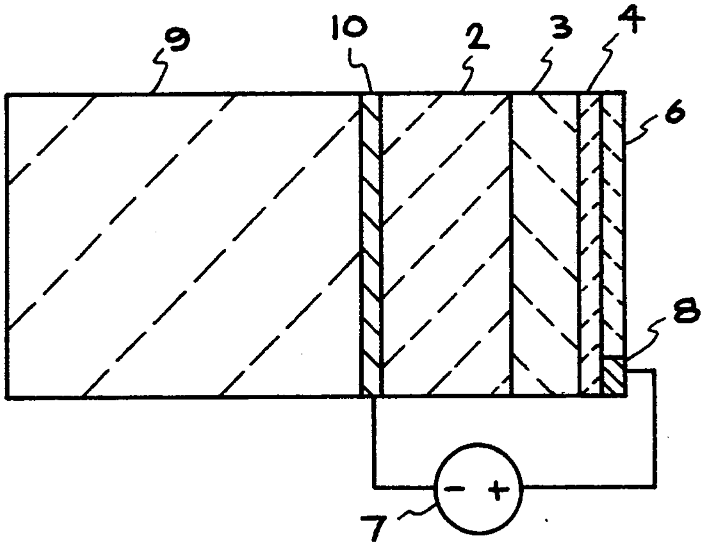
FIG. 3*a* shows the layer structure for a photocathode which was grown in reverse order/and bonded to a mechanical support.
Figure 3B:
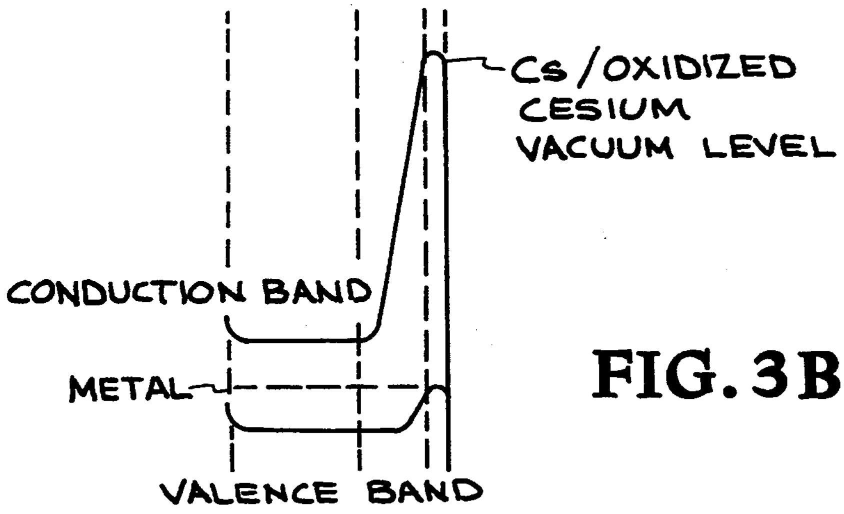
FIG. 3*b* shows the energy bands for a bonded photocathode without any applied bias voltage.
Figure 3C:
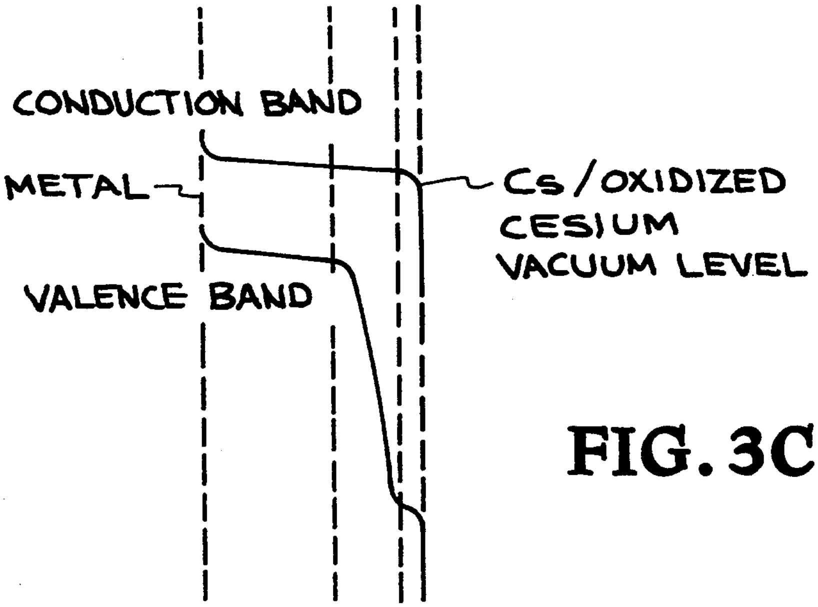
FIG. 3*c* shows the energy bands for a bonded photocathode with positive bias applied to the emitter contact with respect to the absorber contact.

Another method of producing an infrared sensitive photocathode, as shown in FIG. 3*a*, comprises in sequence: providing substrate 1; epitaxially growing electron emitting layer 4 onto substrate 1; epitaxially growing energy transition layer 3 onto electron emitting layer 4; epitaxially growing infrared absorbing layer 2 onto energy transition layer 3; depositing metal layer 10 onto infrared absorbing layer 2 for electrical contact; bonding the infrared absorbing layer 2 side of the wafer to a mechanically strong substrate (preferably an IR transparent material); exposing electron emitting layer 2 by removing the substrate using mechanical abrasives and/or chemical polishing; and depositing cesium layer 6 onto a portion of electron emitting layer 4. Alternatively, hole block layer 5 may be grown onto electron emitting layer 4 and energy transition layer 3 may then be grown onto layer 5. Metal layer 8 may be deposited onto a portion of electron emitting layer 4 prior to the deposition of cesium layer 6. In operation, metal layer 8 is positively biased with respect to IR absorbing layer 2. The quantum efficiency of the photocathode may be optimized by exposing cesium layer 6 to trace quantities of oxidants (i.e. $O_2$, $N_2O$, $F_2$, and $NF_3$) while cesium layer 6 is being deposited. Producing the layers in reverse order reduces the number of defects in energy transition layer 3 and electron emitting layer 4 along with the detrimental effects of such defects as described earlier.

Figure 1B:
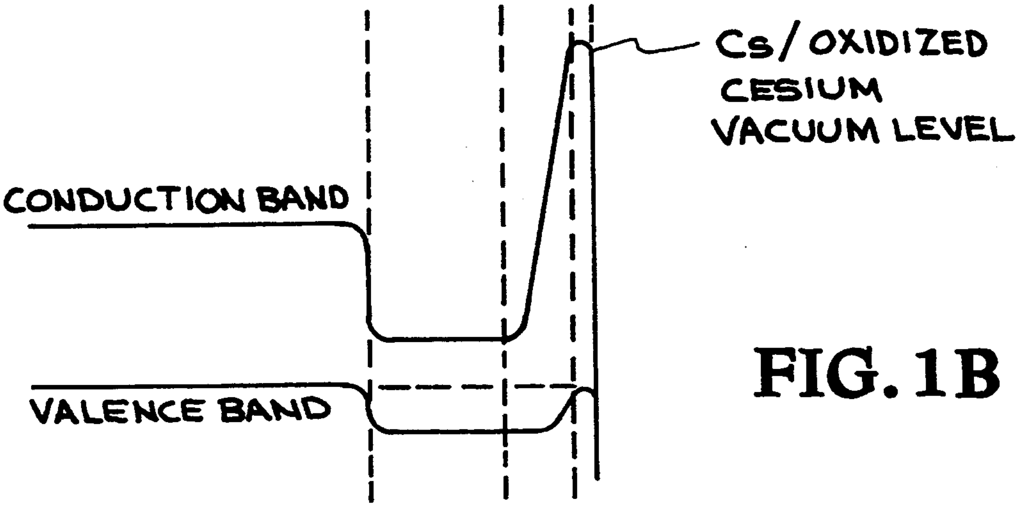
FIG. 1*b* shows the energy bands of the preferred embodiment when the photocathode is unbiased with Cs/oxidized cesium on the surface.
Figure 1C:
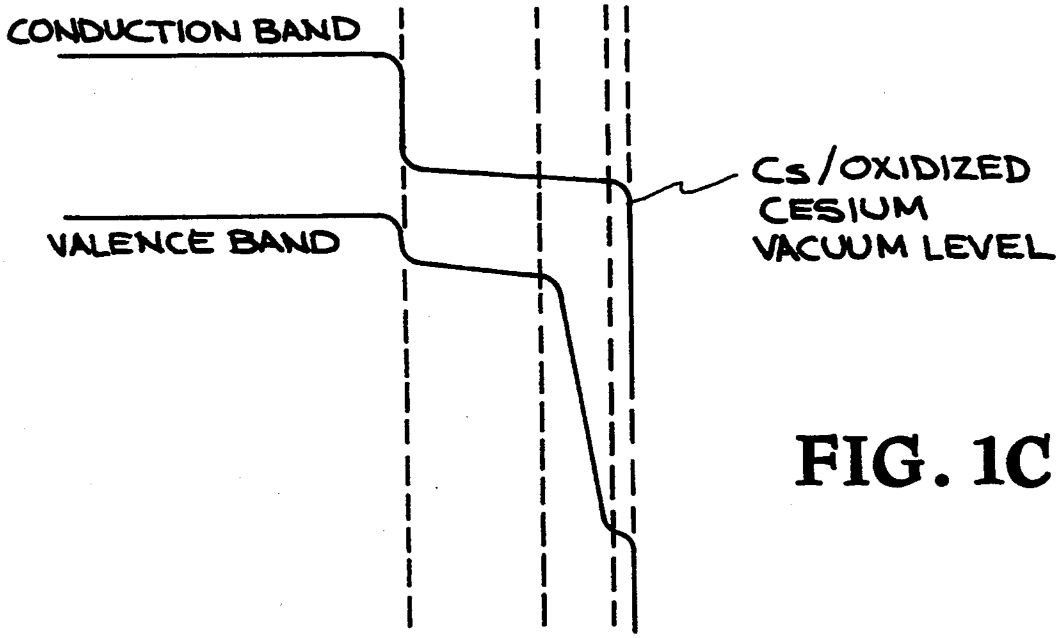
FIG. 1*c* shows the energy bands of the preferred embodiment with Cs/oxidized cesium on the surface when the emitter is biased to a positive voltage with respect to the substrate.

The energy bands for the un-biased photocathode are shown in FIG. 1*b*. The energy bands for the case where the emitter is biased to a positive voltage with respect to the substrate are shown in FIG. 1*c*. For the biased case, infrared photons of suitably long wavelength pass through substrate 1 or emitter 4 and energy transition layer 3 and are absorbed in absorbing layer 2. The applied bias generates an electric field that counteracts the built-in electric field generated by the bandgap grading in energy transition layer 3. Photogenerated electrons in absorbing layer 2 are propelled toward emitter 4. The thickness and doping level of layer 4 must be large enough to avoid full depletion of its doped carriers. Full depletion of layer 4 would lower the energy of its conduction band below the vacuum level of the Cs/oxidized cesium activating layer, significantly reducing the overall device quantum yield.

If GaSb is used as a substrate, GaSb, InAs or an $InAs/Ga_wIn_yAl_{1-y-w}Sb$ superlattice can be used as the IR absorbing layer with little lattice mismatch. If GaSb is used as the IR absorbing layer, the energy transition layer will consist of a layer of $Ga_xAl_{1-x}Sb$ where $1-x$ is graded from a value near zero at the absorber interface to a value of 0.7 at the emitter interface. If InAs or an $InAs/Ga_wIn_yAl_{1-y-w}Sb$ superlattice is used as the IR absorber, then the energy transition layer will consist of two sub-layers. The first sub-layer, which is adjacent to the superlattice absorber, will be an $InAs/Ga_wIn_yAl_{1-y-w}Sb$ superlattice where the thickness of the InAs superlattice layers in the transition layer are progressively graded from 20 nm or less, in the case of the InAs absorber, or from the thickness used in the superlattice absorber, to one monolayer, and with the Al mole fraction, $1-y-w$, possibly increased to raise the energy of the effective conduction band. Grading the thickness of the $Ga_wIn_yAl_{1-y-w}Sb$ layers in the superlattice can also raise the effective conduction band, but that thickness cannot be made significantly more than 10 nm without reducing the electron transport and, hence, the device quantum yield. The second sub-layer is composed of $Ga_xAl_{1-x}Sb$ where $1-x$ is graded from a value near zero to a value of 0.7 at the emitter interface. Using GaSb as both the substrate and the absorber produces a photocathode that cannot be used in the transmission mode. Using GaSb as the substrate and InAs or an $InAs/Ga_wIn_yAl_{1-y-w}Sb$ superlattice as the IR absorber, a transmission photocathode with a short wavelength cut-off of 1.7 $\mu m$ is produced. If GaAs is used as a substrate, transmission photocathodes may be constructed that have a short wavelength cut-off of 0.9 $\mu m$, making each of these photocathodes "solar-blind".

Figure 2A:
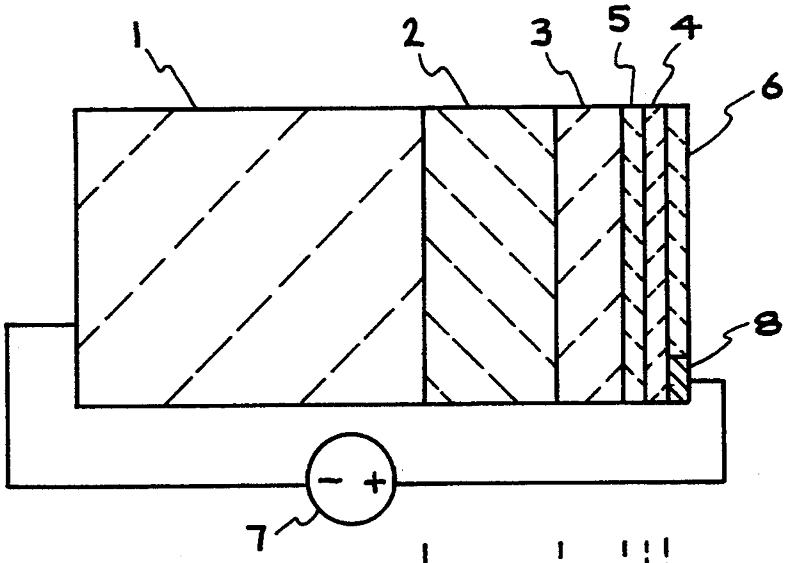
FIG. 2*a* shows the layer structure for a photocathode incorporating a hole-blocking layer.
Figure 2B:
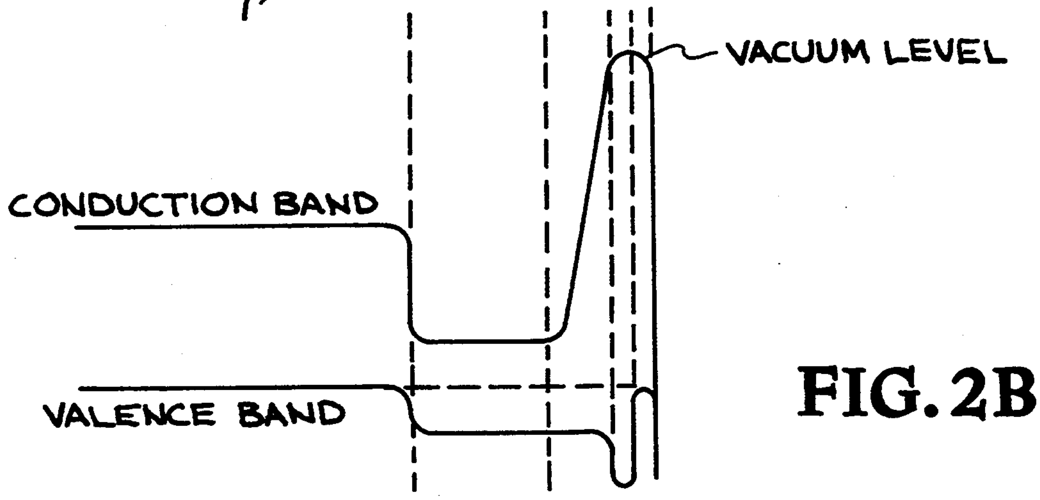
FIG. 2*b* shows the energy bands for a photocathode with Cs/oxidized cesium on the surface incorporating a hole-blocking layer when the surface is unbiased.
Figure 2C:
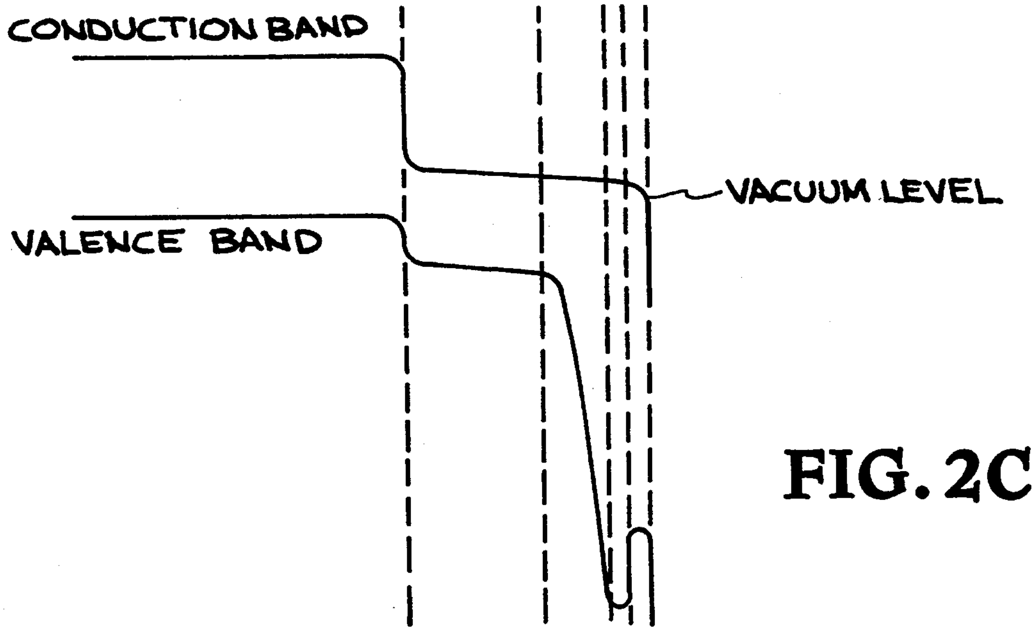
FIG. 2*c* shows the energy bands for a photocathode with Cs/oxidized cesium on the surface when the emitter is biased to a positive voltage with respect to the substrate.

FIG. 2*a* shows the layer structure for a photocathode incorporating hole-blocking layer 5 between emitter 4 and energy transition layer 3. The combination of the IR-absorbing semiconductor (superlattice or GaSb or InAs) and the $Ga_xAl_{1-x}Sb$ electron emitter provides advantages not previously known. Using $Ga_xAl_{1-x}Sb$ as a photocathode emitter will enable the fabrication of nearly defect-free, lattice-matched transitions between IR absorbing layers, the GaSb substrate, and the $Ga_xAl_{1-x}Sb$ emitter. For response out to 1.7 $\mu m$, GaSb is used as an IR absorber with $Ga_{1-x}Al_xSb$ as an emitter. For response out to 4 $\mu m$, InAs is used as an IR absorber with $Ga_{1-x}Al_xSb$ as an emitter. The strained $InAs/Ga_wIn_yAl_{1-y-w}Sb$ superlattice is also lattice matched to GaSb and has the advantage that by varying the relative thicknesses of the superlattice layers and the mole fraction $1-y-w$, it is possible to create IR absorbers with a variety of effective bandgaps. IR absorption in such structures has been demonstrated by others out to 12.5 $\mu m$.

Changes and modifications in the specifically described embodiments, such as the use of 0.8 or 0.9 mole fraction of Al in the $Ga_xAl_{1-x}Sb$ emitter, can be carried out without departing from the scope of the invention, which is intended to be limited by the scope of the appended claims.

We claim:

1. A photocathode comprising in sequence:

(a) a substrate;

(b) an infrared (IR) absorbing layer comprising a $InAs/Ga_wIn_yAl_{1-y-w}Sb$ superlattice;

(c) an energy transistion layer;

(d) an electron emitting layer; and (e) a layer of cesium (Cs).

2. The photocathode as recited in claim 1, including a metal layer in contact with said electron emitting layer and said Cs layer.

3. The photocathode as recited in claim 2, wherein said electron emitting layer comprises a coating of trace quantities of oxidants with Cs, wherein said oxidants are selected from a group consisting of Oxygen ($O_2$), Nitrous Oxide ($N_2O$), Fluorine ($F_2$), and Nitrogen Fluoride ($NF_3$).

4. The photocathode as recited in claim 2, wherein said substrate is selected from a group consisting of GaSb and GaAs.

5. The photocathode as recited in claim 4, wherein said energy transition layer is comprised of first and second sub-layers, and wherein said first sub-layer is adjacent to said IR absorbing layer.

6. The photocathode as recited in claim 2, additionally including a positive voltage bias between said metal layer and said substrate.

7. The photocathode as recited in claim 1, wherein said electron emitting layer is comprised of $Ga_xAl_{1-x}Sb$.

8. The photocathode as recited in claim 1, additionally including means for cooling said photocathode wherein said cooling means are in contact with said IR absorbing layer.

9. A photocathode comprising in sequence:

(a) a substrate;

(b) an infrared (IR) absorbing layer comprising GaSb;

(c) an energy transistion layer comprised of a layer of $Ga_xAl_{1-x}Sb$ where $1-x$ is graded from a value of zero at the absorbing layer to a value of 0.7 at the emitting layer;

(d) an electron emitting layer;

(e) a layer of cesium (Cs); and (f) including a metal layer in contact with said electron emitting layer and said Cs layer.

10. A photocathode comprising in sequence:

(a) a substrate selected from a group consisting of GaSb and GaAs;

(b) an infrared (IR) absorbing layer selected from a group consisting of InAS and a InAS/$Ga_wIn_yAl_{1-y-w}Sb$ superlattice;

(c) an energy transistion layer comprised of first and second sub-layers, wherein said first sub-layer is adjacent to said IR absorbing layer, wherein said first sub-layer is comprised of InAs and a InAs/$Ga_wIn_yAl_{1-y-w}Sb$ superlattice;

(d) an electron emitting layer;

(e) a layer of cesium (Cs); and (f) including a metal layer in contact with said electron emitting layer and said Cs layer.

11. The photocathode as recited in claim 10, wherein said InAs layers in said superlattice have thicknesses that are progressively graded from a thickness of said IR absorbing layer to one monolayer at an interface to said second sub-layer.

12. The photocathode as recited in claim 10, wherein said InAs layers have a thickness that is progressively graded from a maximum of 20 nanometers to one monolayer.

13. The photocathode as recited in claim 10, wherein said second sub-layer comprises $Ga_xAl_{1-x}Sb$.

14. The photocathode as recited in claim 13, wherein $1-x$ is graded from a value at or near zero at said first sub-layer to a value of 0.7 at an interface of said electron emitting layer.

15. A single crystal photocathode, comprising an infrared absorbing semiconductor comprising a InAs/$Ga_wIn_yAl_{1-y-w}Sb$ superlattice, wherein said infrared absorbing semiconductor is adjacent to an electron emitter comprised of $Ga_xAl_{1-x}Sb$.

16. A photocathode as recited in claim 15, wherein x is less than 0.4.

17. A photocathode comprising in sequence:

(a) a substrate selected from a group consisting of GaSb and GaAs;

(b) an infrared (IR) absorbing layer;

(c) an energy transistion layer comprised of first and second sub-layers, wherein said first sub-layer is comprised of a InAs/$Ga_xIn_yAl_{1-y-x}Sb$ superlattice, wherein said second sub-layer comprises $Ga_xAl_{1-x}Sb$, and wherein said IR absorbing layer comprises a InAs/$Ga_wIn_yAl_{1-y-w}Sb$ superlattice, and wherein said first sub-layer is adjacent to said IR absorbing layer;

(d) an electron emitting layer; and (e) a layer of cesium (Cs).

* * * * *